United States Patent
Guo et al.

(10) Patent No.: US 9,936,609 B2
(45) Date of Patent: Apr. 3, 2018

(54) MOBILE TERMINAL HEAT DISSIPATION MECHANISM AND TERMINAL HAVING SAME

(71) Applicant: ZTE Corporation, Shenzhen (CN)

(72) Inventors: Yuanlong Guo, Shenzhen (CN); Zhengwei Han, Shenzhen (CN)

(73) Assignee: ZTE CORPORATION, Shenzhen (CN)

( * ) Notice: Subject to any disclaimer, the term of this patent is extended or adjusted under 35 U.S.C. 154(b) by 0 days.

(21) Appl. No.: 15/114,217

(22) PCT Filed: Aug. 13, 2014

(86) PCT No.: PCT/CN2014/084316
§ 371 (c)(1),
(2) Date: Jul. 26, 2016

(87) PCT Pub. No.: WO2015/109820
PCT Pub. Date: Jul. 30, 2015

(65) Prior Publication Data
US 2017/0006730 A1   Jan. 5, 2017

(30) Foreign Application Priority Data
Jan. 26, 2014  (CN) .................... 2014 2 0051377 U

(51) Int. Cl.
*H05K 7/20* (2006.01)
*H05K 5/02* (2006.01)
*H01R 24/62* (2011.01)

(52) U.S. Cl.
CPC ........... *H05K 7/2039* (2013.01); *H01R 24/62* (2013.01); *H05K 5/0278* (2013.01); *H05K 7/20127* (2013.01)

(58) Field of Classification Search
CPC . H01L 2924/00014; H01L 2224/73265; H01L 2924/181; G06F 21/86;
(Continued)

(56) References Cited

U.S. PATENT DOCUMENTS 5,394,506 A * 2/1995 Stein ......................... A61L 9/03
219/202
7,903,418 B2 * 3/2011 Tracy ....................... G06F 1/203
165/185

(Continued)

FOREIGN PATENT DOCUMENTS

CN    201278544 Y    7/2009
CN    201332563 Y    10/2009
(Continued)

OTHER PUBLICATIONS

International Search Report for corresponding application PCT/CN2014/082853 filed Aug. 13, 2014; dated Nov. 19, 2014.

*Primary Examiner* — Adam B Dravininkas
(74) *Attorney, Agent, or Firm* — Cantor Colburn LLP

(57) ABSTRACT

The present disclosure discloses a heat dissipation mechanism of the mobile terminal and a mobile terminal having the heat dissipation mechanism. In certain embodiments, the heat dissipation mechanism includes: a shell defining at least one heat dissipation window and a moving part connected with the shell. The moving part is used for by a user to open or close the at least one heat dissipation window. The heat dissipation mechanism may be used to effectively reduce surface temperature of the mobile terminal while the mobile terminal is in operation. Such a dissipation mechanism of the mobile terminal is suitable for mobile terminals and meets the demand for relatively high power consumption, ultra-thinness and miniaturization of the mobile terminals.

14 Claims, 2 Drawing Sheets

(58) Field of Classification Search
CPC .. G06F 21/79; G06F 2221/2129; G06F 1/203; G06F 1/1656; G06F 2200/1633; G06F 11/00; G06F 1/20; H05K 1/141; H05K 7/20409; H05K 13/00; H05K 2201/09081; H05K 5/0217; H05K 1/0215; H05K 2201/10386; H05K 2201/10446; H05K 5/0221; H05K 5/0226; H05K 7/20418; H05K 7/20436; H05K 9/0007; H05K 9/0047; H05K 9/0079; H05K 9/0081; H05K 5/03; H05K 5/061; H05K 5/0017; H05K 5/02; H05K 5/0247; H05K 5/068; H05K 5/069; H05K 5/20127; H05K 5/0278; H05K 7/2039; H01R 24/62; H01R 2107/00

See application file for complete search history.

(56) References Cited

U.S. PATENT DOCUMENTS

| | | | | |
|---|---|---|---|---|
| 8,032,014 | B2* | 10/2011 | Cheung | A61L 9/03 392/386 |
| 8,469,729 | B2* | 6/2013 | Ding | H01R 13/72 439/131 |
| 2005/0079738 | A1* | 4/2005 | Ahn | H01R 13/447 439/1 |
| 2005/0286241 | A1* | 12/2005 | Tsai | G06F 1/203 361/816 |
| 2006/0258215 | A1* | 11/2006 | Lai | A61L 9/03 439/607.01 |
| 2008/0095522 | A1* | 4/2008 | Deflorian | A61L 9/03 392/387 |
| 2008/0232060 | A1* | 9/2008 | Yu | G06K 19/07732 361/731 |
| 2010/0176213 | A1* | 7/2010 | Belongia | A01M 1/2077 239/56 |
| 2011/0104954 | A1* | 5/2011 | Zhao | H05K 5/0278 439/660 |
| 2011/0237099 | A1* | 9/2011 | Ni | G06K 19/07732 439/142 |
| 2014/0092555 | A1* | 4/2014 | Hua | H05K 7/20136 361/695 |

FOREIGN PATENT DOCUMENTS

| | | |
|---|---|---|
| CN | 201616974 U | 10/2010 |
| CN | 201781727 U | 3/2011 |
| CN | 202918445 U | 5/2013 |
| EP | 2182789 A1 | 5/2010 |

\* cited by examiner

MOBILE TERMINAL HEAT DISSIPATION MECHANISM AND TERMINAL HAVING SAME

FIELD

Present disclosure relates to a mobile terminal and in particular to a heat dissipation mechanism of the mobile terminal and a terminal including the heat dissipation mechanism.

BACKGROUND

With rapid development of wireless technology, demands for miniaturization of terminal products are increasing. Mobile terminal products having low cost, ultra-thin fashion appearance and high performance have become a main market demand.

On the other hand, a negative effect caused by miniaturization and performance improvement is insufferable heat value, which is harmful for performance of products and user experience.

Generally, traditional heat dissipation ways for a mobile terminal is to increase an internal space of a shell or tag at least one heat sink to increase heat dissipation and so on, so as to ensure uniformity of heat distribution on a surface of the shell as far as possible. Because of volume increase, such design is not suitable for products which have large power consumption and require ultra-thin appearance and miniaturization. So it is necessary to design a heat dissipation device so as to solve a design bottleneck between decreasing terminal volume and increasing heat value.

SUMMARY

A general description for the present disclosure here does not necessarily cover all aspects, all scope, and all features of the present disclosure.

The present disclosure relates to a heat dissipation mechanism of a mobile terminal that can effectively reduce surface temperature when a terminal device operates and can be suitable for devices having relatively high power consumption and having relatively high requirements for ultra-thinness and miniaturization.

In an exemplary embodiment, the heart dissipation mechanism of the mobile terminal includes: a shell provided with at least one heat dissipation window and a moving part connected with the shell. The moving part is used for opening or closing the at least one heat dissipation window.

In certain embodiments, the moving part defines at least one heat dissipation opening, the moving part opens the at least one heat dissipation window by moving to a first position where the at least one heat dissipation opening overlaps with the at least one heat dissipation window, and the moving part closes the at least one heat dissipation window by moving to a second position where the at least one heat dissipation opening does not overlap with the at least one heat dissipation window.

In certain embodiments, the moving part defines are one or more heat dissipation openings. A distance between adjacent heat dissipation openings among the multiple heat dissipation openings may be equal to or greater than a width of the heat dissipation window. A width of the heat dissipation opening may be smaller than or equal to a width of the heat dissipation window.

In certain embodiments, the shell further includes a guide rail arranged around the at least one heat dissipation window, and the moving part moves along the guide rail to open or close the at least one heat dissipation window.

In another aspect, the present disclosure relates to a mobile terminal. In certain embodiments, the mobile terminal includes the above-mentioned heat dissipation mechanism of the mobile terminal.

In certain embodiments, the mobile terminal further includes: a rotatable Universal Serial Bus (USB) plug positioned at one end of the shell, and one end of the moving part is connected with the USB plug; when the USB plug rotates to a first position, the moving part opens the at least one heat dissipation window; when the USB plug rotates to a second position, the moving part closes the at least one heat dissipation window.

In certain embodiments, the one end of the moving part connecting with the USB plug is a part made of bendable flexible material, the other end of the moving part is a part made of hard material, and the at least one heat dissipation opening is arranged on the part made of the hard material.

In certain embodiments, the mobile terminal further includes: a USB plug located on the shell, and the moving part has an operation part for a user to open and close the at least one heat dissipation window manually.

In certain embodiments, the mobile terminal is a mobile data card.

The heat dissipation mechanism of the mobile terminal provided by the embodiments is a heat dissipation window which can be opened or closed by opening or closing the moving part arranged on the heat dissipation window. Compared with heat conduction ways by increasing air layer thickness of cavity interior, using USB interface or transverse heat conduction of heat sink, the structure of the present disclosure is with low cost, better effect and can effectively reduce the surface temperature of the terminal devices. At the same time, after closing the heat dissipation window, a terminal device stay in a closed state and is protected from dust. The mechanism of the present disclosure sets up heat dissipation window on the shell of terminal and opens or closes the heat dissipation window by the moving part. The moving part may be designed by the size of terminal without increasing the size of terminal, and can be suitable for devices having relatively high power consumption and having relatively high requirement for ultra-thinness and miniaturization.

BRIEF DESCRIPTION OF THE DRAWINGS

The accompanying drawings described here are used for providing an indepth understanding of the present disclosure, and constitute a part of the application; schematic embodiments of the present disclosure and description thereof are used for illustrating the present disclosure and not intended to form an improper limit to the present disclosure, wherein.

DETAILED DESCRIPTION

The present disclosure is described below with reference to the accompanying drawings and embodiments in detail. It needs to be noted that the embodiments of the present disclosure and the features of the embodiments may be combined with each other if there is no conflict. In addition, it should be understood that in order to achieve an aim of clarity, the accompanying drawings and specifications omit the representation and description of components and processes, which are irrelevant to the present disclosure and known to the skilled person in the art.

Figure 1:
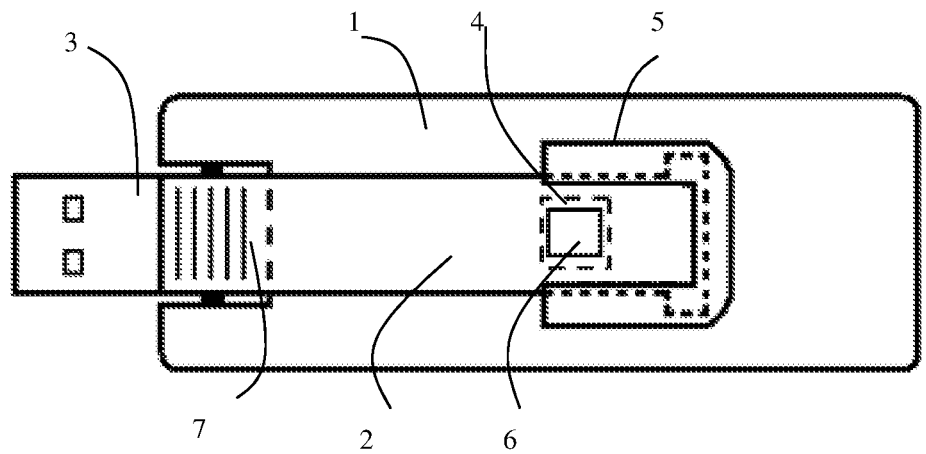
FIG. 1 shows a structural schematic diagram of a heat dissipation mechanism of a mobile terminal according to certain embodiments of the present disclosure.
Figure 3:
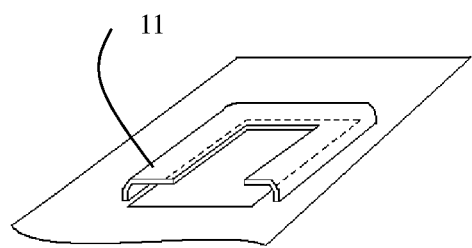
FIG. 3 shows a structural schematic diagram of a shell of a heat dissipation mechanism of a mobile terminal according to certain embodiments of the present disclosure.

Refer to FIG. 1 and FIG. 3, the present disclosure relates to a mobile terminal having a heat dissipation mechanism. In certain embodiments, the mobile terminal may be a mobile data card. The mobile data card may include a shell 1, a moving part 2 and a rotatable USB plug 3. The shell 1 defines at least one heat dissipation window (such as a heat dissipation window 4 as shown in FIG. 1) nearby inner heat resource (for example, a power amplifier device) of the mobile terminal and a guide rail arranged around the heat dissipation window 4, as shown in FIG. 3. In certain embodiments, the moving part 2 may be connected with the shell 1 along with the guide rail 5. The moving part 2 defines at least one heat dissipation opening and moves along with the guide rail 5 so that makes up heat dissipation channel when a heat dissipation opening 6 overlaps with the heat dissipation window 4. The heat dissipation channel can effectively reduce the surface temperature of the terminal devices. When moving part 2 moves to another position along the guide rail 5, the heat dissipation opening 6 does not overlap with the heat dissipation window 4 and the moving part 2 cover on the heat dissipation window 4. On such situation, the mobile terminal can be in a closed state and avoid dust. A width of the heat dissipation opening 6 is smaller than a width of the heat dissipation window 4 in this embodiment; while in other embodiments, the width of heat dissipation opening 6 can be set to equal to the width of the heat dissipation window 4.

In certain embodiments, the USB plug 3 may be located on one end of the shell 1, and is rotatable. One end of the moving part 2 is connected with the USB plug 3 and is configured to be flexible with the rotatable USB plug. The end connecting the moving part 2 with the USB plug 3 is a part made of bendable flexible material, the other end of the moving part 2 is a part made of hard material, and the heat dissipation opening 6 arranges on the part made of the hard material. During a process of opening the USB plug 3, the other end of the moving part 2 moves when the part made of bendable flexible material of moving part 2 becomes straight slowly, and a movement locus of the moving part 2 is limited by the guide rail 5. The bendable flexible material of the moving part 2 will be straight completely when the USB plug 3 opens completely. The heat dissipation opening 6 of the moving part 2 overlaps with the heat dissipation window 4 exactly and makes up the heat dissipation channel. The moving part 2 moves towards to an opposite direction when closing the USB plug 3. The heat dissipation opening 6 of the moving part 2 does not overlap with the heat dissipation window 4 after closing the USB plug 3 completely, and then the heat dissipation window 4 is covered by the moving part 2 so that makes up an effect of closed. The mobile terminal stays in power-off and can be protected from water and dust.

In certain embodiments, referring now to FIG. 2, the present disclosure relates to a mobile terminal with a heat dissipation mechanism of which a structure is substantially similar to the mobile terminal discussed in earlier sections. The description of the similar structure will not be repeated here. In an exemplary embodiment, the shell 11 includes two heat dissipation windows 14. The moving part 12 defines two heat dissipation openings 16. A distance between the two heat dissipation openings 16 may be greater than a width of the heat dissipation window 14. In other embodiments, the distance between the two heat dissipation openings 16 may also be set to equal to the width of the heat dissipation window 14.

Figure 2A:
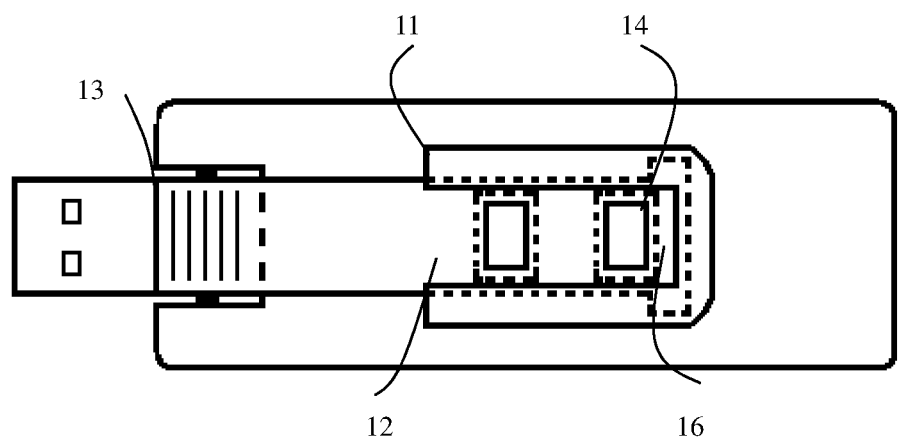
FIG. 2a shows a schematic diagram of a heat dissipation window when opened and FIG. 2b shows a schematic diagram of a heat dissipation window when closed, according to certain embodiments of the present disclosure.
Figure 2B:
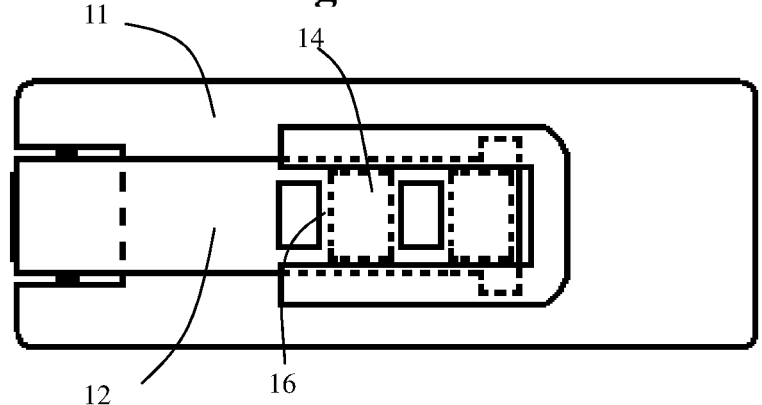

Refer to FIG. 2a, when the USB plug 13 is opened completely, the two heat dissipation openings 16 overlaps the two heat dissipation windows 14 of the shell 11 exactly and make up heat dissipation channels. The moving part 12 moves to an opposite direction during a process of closing the USB plug 13. Refer to FIG. 2b, the two heat dissipation openings 16 do not overlap with the two heat dissipation windows 14 when closing the USB plug 13 completely and the two heat dissipation windows 14 are covered by the moving part 12.

Figure 4A:
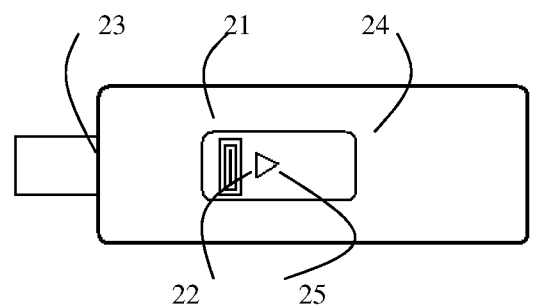
FIGS. 4a and 4b shows a structural schematic diagram of a heat dissipation window when closed and opened, respectively, according to certain embodiments of the present disclosure.
Figure 4B:
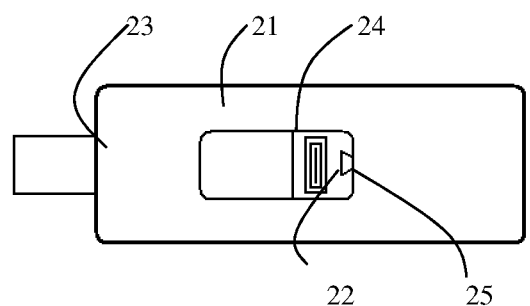

Refer to FIGS. 4a and 4b, the present disclosure relates to a mobile terminal with heat dissipation mechanism. In certain embodiments, the mobile terminal may be a mobile data card. The mobile data card includes a shell 21, a moving part 22 and a USB plug 23. In the embodiment, there is no connection relationship between the moving part 22 and the USB plug 23, that is, the moving part 22 does not move with the USB plug 23. The shell 21 defines a heat dissipation window 24 nearby inner heat resource (a power amplifier device) of the mobile terminal. The moving part 22 is nested inside of the shell 21. There are many ways to nest, such as a guide rail or slide. The moving part 22 includes an operation part 25 for users to open and close the heat dissipation window 24 manually. In certain embodiments, the moving part 22 also can be set on the outside of the shell 21. As shown in FIG. 4a, the heat dissipation window 24 is in a closed state and is covered by the moving part 22. As shown in FIG. 4b, the heat dissipation window 24 is in an open state. When a user move the moving part 22 by the operation part 25, the heat dissipation window 24 is opened and formed a heat dissipation channel so that can highly reduce surface temperature of the mobile terminal.

Certainly, in other embodiments which are in the same situation as this embodiment (the moving part does not move with the USB plug), the number of the heat dissipation openings can be more than one. The users can operate the moving part manually to make the heat dissipation openings overlap with the heat dissipation window of the shell and form a heat dissipation channel. The users also can operate the moving part to make the heat dissipation openings do not overlap with the heat dissipation window so that the heat dissipation window is covered by the moving part.

The present disclosures provided by the embodiments are based on the theory of convection. The heat made when a terminal works will increase the inner temperature and air pressure, and an original heat power is generated. So the heat dissipation mechanism arranged on appropriate location will force convection channel and rapidly deliver heat to environment space out of the terminal. The heat dissipation mechanism provided by the present disclosure has the heat dissipation window to open or close. And the moving part makes the heat dissipation window open or close. The structure of the present disclosure is with low cost, better effect and can effectively reduce the surface temperature of the terminal devices. At the same time, when closing the heat dissipation window, a terminal device stays in a closed state and is protected from dust. A mechanism of the present disclosure sets up heat dissipation window on the shell of the terminal and opens or closes the heat dissipation window by a moving part. The moving part can be designed by the size of the terminal without increasing the size of the terminal, and can be suitable for devices having relatively high power consumption and having relatively high requirement for ultra-thinness and miniaturization.

The above is only the example embodiments of the present disclosure and not intended to limit a protection scope of the of the present disclosure; any equivalent replacements of structure or flow performed based on contents of the specification and accompanying drawings of the present disclosure, or direct or indirect application of the equivalent replacements in other related technical fields shall fall within the protection scope of the present disclosure.

INDUSTRIAL APPLICABILITY

As described above, a heat dissipation mechanism of a mobile terminal and a terminal having the heat dissipation mechanism provided by the embodiments of the present disclosure have the following beneficial effects: compared with heat conduction ways by increasing air layer thickness of cavity interior, using USB interface or transverse heat conduction of heat sinks, the structure of the present disclosure is with low cost, better effect and can effectively reduce the surface temperature of the terminal devices. At the same time, when closing the heat dissipation window, a terminal device stays in a closed state and is protected from dust. The mechanism of the present disclosure sets up heat dissipation window on the shell of a terminal and opens or closes the heat dissipation window by a moving part. The moving part can be designed by the size of the terminal without increasing the size of the terminal, and can be suitable for devices having relatively high power consumption and having relatively high requirement for ultra-thinness and miniaturization.

What is claimed is:

1. A heat dissipation mechanism of a mobile terminal, comprising:
    a shell provided with at least one heat dissipation window and a moving part connected with the shell, wherein the moving part is used for opening or closing the at least one heat dissipation window;
    wherein one end of the moving part is a part made of bendable flexible material, and the other end of the moving part is a part made of hard material, the one end of the moving part is configured to connect with a rotatable Universal Serial Bus (USB) plug of the mobile terminal.

2. The heat dissipation mechanism of the mobile terminal as claimed in claim 1, wherein the moving part is provided with at least one heat dissipation hole, the moving part opens the at least one heat dissipation window by moving to a position in which the at least one heat dissipation hole overlaps with the at least one heat dissipation window; the moving part closes the at least one heat dissipation window by moving to a position in which the at least one heat dissipation hole does not overlap with the at least one heat dissipation window.

3. The heat dissipation mechanism of the mobile terminal as claimed in claim 2, wherein there are one or multiple heat dissipation holes, a distance between adjacent heat dissipation holes among the multiple heat dissipation holes is equal to or greater than a width of the heat dissipation window.

4. A mobile terminal, comprising the heat dissipation mechanism of the mobile terminal as claimed in claim 3.

5. The heat dissipation mechanism of the mobile terminal as claimed in claim 2, wherein a width of the heat dissipation hole is smaller than or equal to a width of the heat dissipation window.

6. A mobile terminal, comprising the heat dissipation mechanism of the mobile terminal as claimed in claim 5.

7. A mobile terminal, comprising the heat dissipation mechanism of the mobile terminal as claimed in claim 2.

8. The heat dissipation mechanism of the mobile terminal as claimed in claim 1, wherein the shell further comprises a guide rail arranged around the at least one heat dissipation window, and the moving part moves along the guide rail to open or close the at least one heat dissipation window.

9. A mobile terminal, comprising the heat dissipation mechanism of the mobile terminal as claimed in claim 8.

10. A mobile terminal, comprising the heat dissipation mechanism of the mobile terminal as claimed in claim 1.

11. The mobile terminal as claimed in claim 10, wherein the mobile terminal further comprises:
    the rotatable Universal Serial Bus (USB) plug fixed at one end of the shell, and one end of the moving part is connected with the USB plug; when the USB plug rotates to a first position, the moving part opens the at least one heat dissipation window; when the USB plug rotates to a second position, the moving part closes the at least one heat dissipation window.

12. The mobile terminal as claimed in claim 11, wherein the at least one heat dissipation hole is arranged on the part made of the hard material.

13. The mobile terminal as claimed in claim 10, wherein the mobile terminal further comprises:
    a USB plug which is fixed on the shell, and the moving part is provided with an operation part for a user to open and close the at least one heat dissipation window manually.

14. The mobile terminal as claimed in claim 10, wherein the mobile terminal is a mobile data card.

* * * * *